(12) United States Patent
Gilliland et al.

(10) Patent No.: US 7,450,381 B2
(45) Date of Patent: Nov. 11, 2008

(54) THERMAL MANAGEMENT APPARATUS AND METHOD FOR PRINTED CIRCUIT BOARDS

(75) Inventors: Don A. Gilliland, Rochester, MN (US); Cary M. Huettner, Rochester, MN (US); Dennis J. Wurth, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 89 days.

(21) Appl. No.: 11/566,277

(22) Filed: Dec. 4, 2006

(65) Prior Publication Data
US 2008/0130225 A1 Jun. 5, 2008

(51) Int. Cl.
*H05K 7/20* (2006.01)

(52) U.S. Cl. .................... 361/695; 361/704; 361/719; 165/80.3; 165/287

(58) Field of Classification Search ............ 361/810, 361/818, 787; 439/66–68, 74, 79; 331/67; 257/690, 698, 707, 713; 174/16.3, 252, 52.4
See application file for complete search history.

(56) References Cited

U.S. PATENT DOCUMENTS

| | | | | |
|---|---|---|---|---|
| 4,399,484 A | * | 8/1983 | Mayer | 361/689 |
| 4,583,056 A | * | 4/1986 | Takeda et al. | 331/67 |
| 5,563,768 A | * | 10/1996 | Perdue | 361/695 |
| 5,712,762 A | * | 1/1998 | Webb | 361/687 |
| 5,724,229 A | * | 3/1998 | Tustaniwskyi et al. | 361/719 |
| 6,736,192 B2 | * | 5/2004 | Chang | 165/80.3 |
| 7,170,745 B2 | * | 1/2007 | Bash et al. | 361/695 |
| 7,233,493 B2 | * | 6/2007 | Wang et al. | 361/695 |
| 7,262,964 B1 | * | 8/2007 | Barsun | 361/695 |
| 2005/0035684 A1 | * | 2/2005 | Fuse et al. | 310/311 |
| 2006/0034051 A1 | * | 2/2006 | Wang et al. | 361/696 |

* cited by examiner

*Primary Examiner*—Boris L. Chervinsky
*Assistant Examiner*—Courtney L Smith
(74) *Attorney, Agent, or Firm*—Dillon & Yudell LLP

(57) ABSTRACT

An apparatus, system, and method for managing cooling within a printed circuit board (PCB) enclosure. The system includes a PCB having a first surface on which electronic components are mounted. Multiple contour control actuators are fixedly disposed in a substantially planar array in z-axis opposition to the first surface of the PCB. Each of the contour control actuators has an extensible end that is electromechanically extendable in parallel with the z-axis normal to the first surface of the PCB. A substantially flexible sheet member is disposed between the extensible ends of the contour control actuators and the first surface of the PCB. The extensible ends contact the flexible sheet member such that the z-axis contour of the flexible sheet member is determined by the z-axis positions of the extensible ends. A contour controller adjusts the z-axis contour of the flexible sheet member by adjusting the relative positions of the extensible ends of one or more of the contour control actuators. The contour controller adjusts the relative positions of the extensible ends in accordance with thermal conditions proximate to the PCB.

12 Claims, 7 Drawing Sheets

THERMAL MANAGEMENT APPARATUS AND METHOD FOR PRINTED CIRCUIT BOARDS

BACKGROUND OF THE INVENTION

1. Technical Field

The present invention relates generally to cooling printed circuit board components and in particular to an apparatus employing an adjustable convection thermal exchange apparatus for cooling printed circuit boards within enclosed or partially enclosed spaces.

2. Description of the Related Art

With microelectronics technology steadily increasing integrated circuit (IC) chip density and the density in which such circuits are mounted onto system planar printed circuit boards (PCBs) (referred to herein alternatively as "circuit cards"), cooling issues are becoming increasingly critical to design of large-scale data processing systems. Electronic systems containing densely packaged components typically utilize fans or blowers for forced-air cooling.

Systems for cooling electronic components mounted within a computer chassis or other enclosure may provide circulation of a fluid coolant medium (usually air) by means of a distributed fan system adapted to circulate air throughout the enclosure. In concert therewith, or in the alternative, strategically positioned chambers, ducts, and baffles may be employed to distribute the forced-air current throughout the enclosure.

Growing requirements for compact, lightweight electronic packages, containing, for example, a large number of closely spaced or stacked electronic circuit boards, have not been fully accommodated by existing cooling systems. Such systems provide insufficient cooling for particular components due to such components being blocked from the coolant flow path by other components or boards, or because of the substantial additional hardware required to implement effective ducts and baffling structures.

A system and apparatus addressing some of these problems is described in U.S. Pat. No. 4,399,484 issued to Mayer. The cooling system described therein employs a convection forced air technique in which a blower drives an airflow generally perpendicular to the planar surfaces of a set of parallel stacked circuit boards. The circuit boards have multiple airflow passages to facilitate passage of the coolant flow through the stacked boards. The forced-air system described by Mayer addresses some of the foregoing problems relating to cooling blocked components while minimizing cooling support infrastructure. However, implementation of such a system would result in uneven heat dissipation, with the aft-stacked boards (i.e. boards furthest from the blower source) receiving a disproportionately ineffective convection stream. Specifically, the speed of the coolant flow is greatly diminished following impingement with the first one or two boards thus reducing the convection heat removal effect. In addition, the forced air convection flow becomes heated as it sequentially passes through each successive board, thus greatly reducing the effectiveness of the air medium as a convective heat removal medium.

Therefore, a need exists for a need for an improved PCB cooling system that overcomes the aforementioned problems. The present invention addresses these and other needs unresolved by the prior art.

SUMMARY OF THE INVENTION

An apparatus, system, and method for managing cooling within a printed circuit board (PCB) enclosure are disclosed herein. The system includes a PCB having a first surface on which electronic components are mounted. Multiple contour control actuators are fixedly disposed in a substantially planar array in z-axis opposition to the first surface of the PCB. Each of the contour control actuators has an extensible end that is electromechanically extendable in parallel with the z-axis normal to the first surface of the PCB. A substantially flexible sheet member is disposed between the extensible ends of the contour control actuators and the first surface of the PCB. The extensible ends contact the flexible sheet member such that the z-axis contour of the flexible sheet member is determined by the z-axis positions of the extensible ends. A contour controller adjusts the z-axis contour of the flexible sheet member by adjusting the relative positions of the extensible ends of one or more of the contour control actuators. The contour controller adjusts the relative positions of the extensible ends in accordance with thermal conditions proximate to the PCB.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF ILLUSTRATIVE EMBODIMENT(S)

Figure 1:
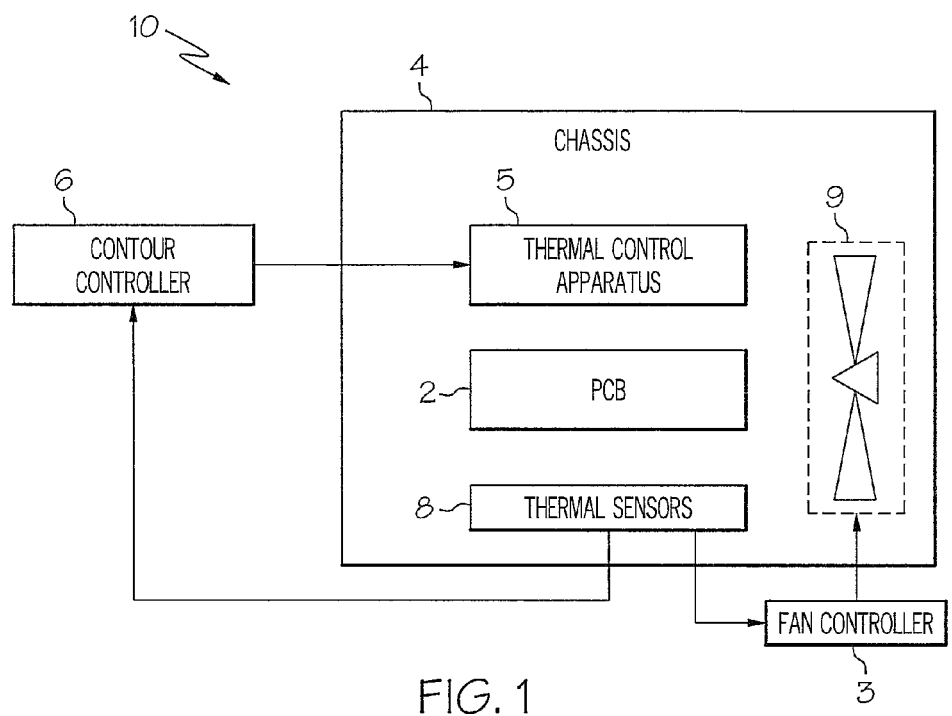
FIG. 1 is a high-level block diagram depicting a thermal management system in accordance with the present invention.

The present invention is described in a preferred embodiment in the following description with reference to the figures. While this invention is described in terms of the best mode for achieving this invention's objectives, it will be appreciated by those skilled in the art that variations may be accomplished in view of these teachings without deviating from the spirit or scope of the present invention. Furthermore, when used and unless otherwise specified, terms such as "outer," "inner," "horizontal," "vertical," "upper," "lower," "front," "back," "over," "under," and other position or orientation related terms are not to be construed as limiting the invention to a particular position or orientation. Instead, such terms are to be construed only on a relative basis with respect to the accompanying depicted embodiments.

The invention is generally directed to a device, system, apparatus, and method for cooling electronic components that may be housed within an electronics mounting package, chassis, or other such enclosures used to house electronic component mounting structures such as printed circuit boards (PCBs). More particularly, the present invention provides improved circuit board enclosure units adapted to adjust convection coolant flows to achieve efficient and evenly distributed cooling across one or more circuit board planes. In a preferred embodiment, the present invention is directed to providing enhanced cooling for PCBs mounted within such fully or partially enclosed circuit board enclosures.

The invention may be utilized to determine, implement, and adjust surface contouring within a PCB enclosure to facilitate desired coolant airflows. The invention may be applied during a thermal design phase as well as dynamically during runtime operations. The surface contouring is preferably determined and adjusted in accordance with thermal data collected from thermal sensors strategically disposed with a PCB enclosure and/or thermal data gathered from within electronic components on a PCB. The surface contouring may also be determined in accordance with airflow data such as fan activation status signals received from a cooling fan.

Within a PCB enclosure and in substantially planar z-axis opposition to a surface of a PCB (the direction substantially normal to the surface of a PCB is referred to herein as the z-axis direction), an array of contour control actuators have extensible ends abutting a flexible sheet. The z-axis contour of the flexible sheet is determined by the relative positions of the extensible ends of the contour control actuators. The absolute or relative z-axis positions of the extensible ends of one or more of the actuators may be adjusted in a closed-loop feedback manner using the thermal data collected from within the enclosure.

During a thermal design phase, and upon achieving a z-axis contour of the flexible surface that achieves desired thermal exchange performance, either the contour of the flexible sheet and/or the z-axis positions of the contour control actuators may be recorded. The recorded contour and/or actuator position data may be used to cast and produce a fixed-form contoured surface that may be deployed within production PCB enclosures. The fixed-form contoured surface may form an interior panel surface within a PCB enclosure and which is disposed in adjacent or opposing proximity to the surface of the PCB within the enclosure.

In an alternate embodiment, one or more thermally controlled contour control actuators and a flexible sheet are dynamically controlled during runtime operations within a PCB enclosure. The contour control actuators, having extensible ends abutting the flexible sheet at respective x-y plane points, dynamically respond to changing thermal conditions by altering the z-axis contour of the flexible sheet in accordance with control signals from the contour controller. Specific embodiments are depicted and described in further detail below with reference to the figures.

With reference to the figures, wherein like reference numerals refer to like and corresponding parts throughout, and in particular with reference to FIG. 1, there is illustrated a high-level block diagram depicting a thermal management system 10. In accordance with the present invention, thermal management system 10 includes features for adjusting surface contouring within a PCB enclosure to generate and/or adjust forced and/or natural convection airflow patterns that provide optimal device cooling. Thermal management system 10 generally comprises a PCB 2 mounted within a substantially enclosed computer chassis 4. As is known the art, computer systems generally include several PCBs, including motherboards, printed circuit cards, etc. In an effort to reduce system footprint, system planars within computer chassis increasingly employ a stacked, multiple PCB approach. In accordance with the present invention, PCB 2 may or may not be mounted within such a stacked arrangement within computer chassis 4. Computer chassis 4 itself generally comprises a substantially enclosed housing or containment unit containing one or more PCBs including PCB 2.

Further included within chassis 4 is a cooling fan 9 for cooling electronic components mounted on PCB 2. Cooling fan 9 may be thermostatically activated/deactivated to maintain one or more points or regions within chassis 4 at or below a specified temperature or within a specified temperature range. In the depicted embodiment, cooling fan 9 is activated/deactivated by a thermostatic fan controller 3. One or more thermal sensors 8 may be utilized to provide the thermal data to fan controller 3 which activates and deactivates cooling fan 9 accordingly. Thermal sensors 8 may include discrete components mounted strategically within chassis 4 on or proximate to PCB 2. Thermal sensors 8 may also or alternatively comprise integrated thermal sensory mechanisms such as temperature sensors integrated within integrated circuit (IC) devices mounted on PCB 2.

Figure 2:
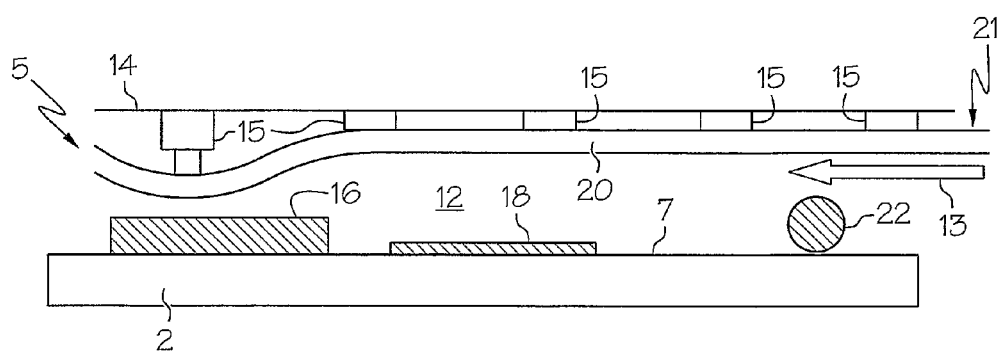
FIG. 2 illustrates a partial cross-section view of the relative disposition of components of a thermal control apparatus with respect to a printed circuit board in accordance with the present invention.

Thermal management system 10 further includes a thermal control apparatus 5, which as explained and depicted in further detail with reference to FIG. 2, includes several features for facilitating thermal exchange performance with respect to PCB 2. Thermal control apparatus 5 is communicatively coupled to receive control signals from a contour controller 6. Contour controller 6 uses thermal data received from one or more of thermal sensors 8 to generate control signals received by thermal control apparatus 5. Thermal control apparatus 5 utilizes the control signals from contour controller 6 to determine, maintain, and adjust the contour of a flexible sheet (depicted in FIG. 2) to direct the flow of a mechanically forced or thermally induced airflow as explained in further detail below. Thermal control apparatus 5 provides a simple and inexpensive thermal management design that adjustably directs and redirects a forced or thermally induced airflow for convectively cooling PCB components within chassis 4.

Referring to FIG. 2, there is illustrated a partial cross-section view of the relative disposition of components of thermal control apparatus 5 with respect to PCB 2 in accordance with the present invention. As shown in the depicted embodiment, thermal control apparatus 5 is disposed in z-axis opposition with respect to PCB 2 with an enclosure space 12 being defined therebetween. PCB 2 comprises a surface 7 on which multiple electronic components, including integrated circuit (IC) devices 16 and 18 and discrete component 22, are mounted within enclosure space 12. IC devices 16 and 18 may be any of a numerous variety of microelectronic devices such as microprocessors or random access memory devices. Discrete component 22 may be any non-IC electronic circuit device such as a resistor, transistor, capacitor, etc.

Consistent with conventional PCB design, PCB 2 generally comprises a thin sheet of plastic having metallized tracks (not depicted) connecting multiple electronic components such as the components 16, 18 and 22 shown in the depicted embodiment. While not depicted in FIG. 2, the components mounted on PCB 2 may further include other IC devices, discrete components, transversely mounted daughtercards, etc.

The components mounted on PCB 2 generate heat during operation and may individually or collectively generate substantial heat that is not adequately removed by the thermostatically controlled airflow generated by cooling fan 9. Insufficient cooling and consequent excessive component temperatures at various positions within enclosure space 12 may result from sheer circuit density or activity, or may be caused by airflow barriers or structural discontinuities within enclosure space 12 resulting from the relative size and positioning of the components on PCB surface 7.

During operation, the electronic components and devices and/or transversely mounted cards or boards mounted on PCB 2 generate significant heat within enclosure space 12. Prior art devices to remove heat within PCB enclosures include fan or blower systems often in combination with complex component and board placement schemes in order to dissipate the component-generated heat. Cooling of PCBs introduces a myriad of logistical problems that are currently addressed by relatively complex and costly overhead devices such as the use of miniature fansinks, heatpipes, and peizo cooling devices.

As further depicted in FIG. 2, thermal control apparatus 5 comprises multiple contour control actuators 15 disposed in a substantially planar manner in z-axis opposition to PCB surface 7. Each of contour control actuators 15 is extensible and retractable in the z-axis direction normal to PCB surface 7. Thermal control apparatus 5 further comprises a substantially flexible sheet member 20 disposed between the extensible ends of contour control actuators 15 and PCB surface 7. Enclosure space 12 is formed and bounded at least in part between PCB surface 7 and flexible sheet 20. Thermal control apparatus 5 directs/redirects airflow within the at least partially enclosed enclosure space 12 to optimize the cooling of the components mounted on PCB 2.

Fundamentally, the relative positions of the extensible ends of contour control actuators 15 determines the z-axis contouring of flexible sheet 20 to controllably adjusts the airflow(s) within enclosure space 12. Contour control actuators 15 may be utilized individually or in any group or subgroup combination to mold flexible sheet 20 into an airflow deflector that directs airflow to areas within enclosure space 12 that facilitate optimal thermal exchange of PCB components during operation. Thermal control apparatus 5 may be employed during a thermal design phase to determine a contouring characteristics of a fixed-form interior PCB enclosure panel. In the alternative, thermal control apparatus 5 may installed within production PCB enclosures for dynamically adjusting airflows within the enclosures during runtime operations. In either implementation, thermal control apparatus 5 advantageously enables surface contouring data to be determined during actual rather than using thermal modeling.

An alternate embodiment utilizes a hybrid application of thermal control apparatus 5. The hybrid application combines the advantage of dynamic airflow adjustment capability with the practical benefits of having a pre-formed static airflow contour design. In the hybrid application, the contour of a fixed-form panel or air foil is determined during the design/test stage and utilized to produce a panel or other internal enclosure structure. When implemented, a position adjustment component is installed with the contour panel to adjustably control the airflow based on dynamic thermal conditions within the enclosure.

The most likely embodiment involves a matrix of these devices whereby the matrix is placed above and opposing the components to be cooled. The contour of flexible sheet 20 is adjusted using closed-loop thermal data feedback such as from thermal sensors 8 to determine an optimal contour. The determined contour design is then used to form a template for the airfoil design that fits into the enclosure cover. In the latter case, the z-axis actuators are not supplied with the product but used during the design stage only.

Continuing with reference to FIG. 2, a primary air flow 13 is mechanically driven by cooling fan 9 and provides a forced air convection medium for cooling components mounted on PCB surface 7. The velocity and impingement of primary air flow 13 on the electronic components within enclosure space 12 may induce differing air pressure regions within enclosure space 12. For example, pronounced low pressure regions may be induced by nozzle/Bernoulli effects within narrowing regions of enclosure space 12 such as between the top of IC device 16 and the lower surface of flexible sheet 20. As a result, and assisted by Bernoulli effect principles whereby the pressure drop through such narrowed passages increases airflow velocity, the rate of convection thermal exchange likewise varies across different regions of enclosure space 12. In this manner, the cooling properties of forced airflow 13 is determined in part by the relative contouring of enclosure space 12 as determined by the relative z-axis spacing between flexible sheet 20 and components mounted on PCB surface 7 as well as surface 7 itself. Furthermore the flow pattern of the fan-induced airflow 13 may be influenced by the thermally generated airflow occurring over and in proximity to heat emitting components on surface 7.

The direction and speed of airflow 13 at various points within enclosure space 12 are influenced by the depicted mutual configuration and orientation of the components mounted onto PCB 2 as well as the contour of flexible sheet 20. The heat removal efficacy is substantially influenced by the direction and velocity flow patters of airflow 13. Thermal control apparatus 5, comprising contour control actuators 15 and flexible sheet 20, provides an efficient and dynamically adjustable heat removal mechanism for PCB enclosures and requires minimal cooling apparatus overhead.

Figure 3:
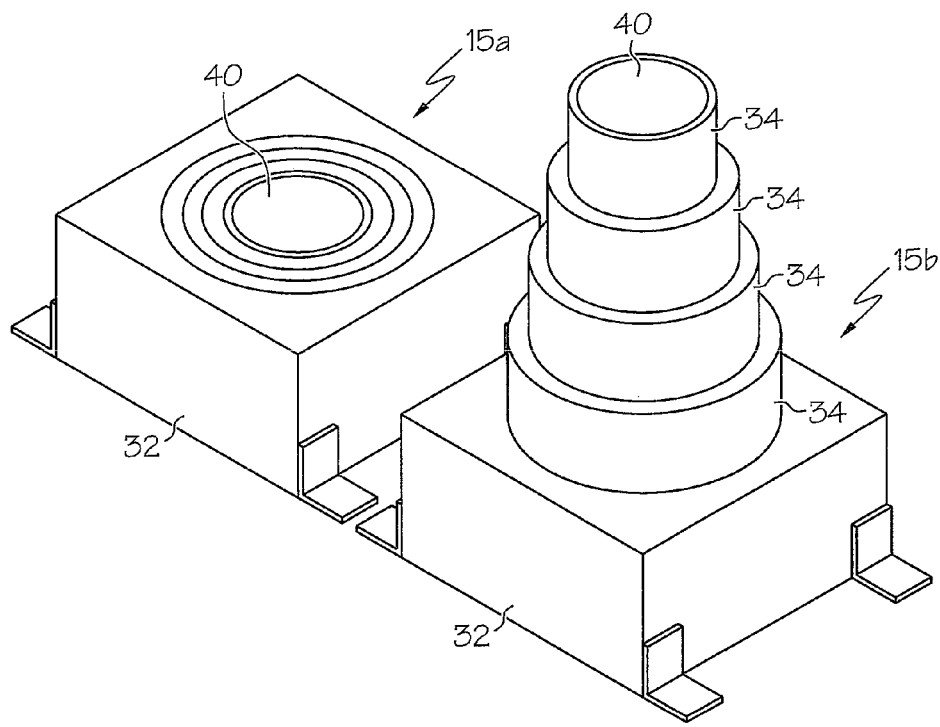
FIG. 3 depicts a perspective view of a pair of contour control actuators in accordance with the present invention.
Figure 4A:
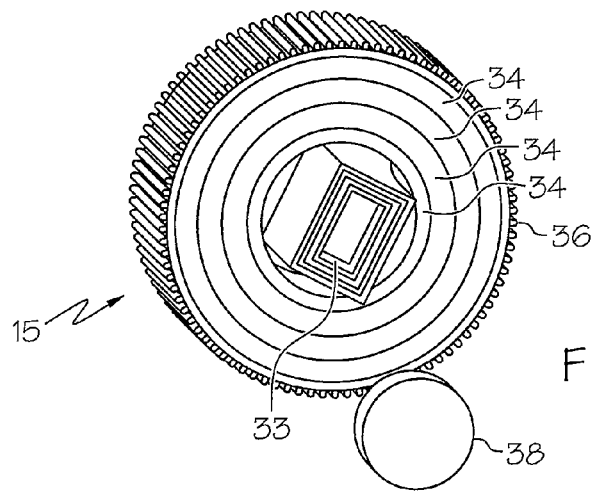
FIGS. 4A-4B illustrate bottom views of the telescopically extensible portion of a contour control actuator in different deployment states in accordance with one embodiment of the present invention.
Figure 4B:
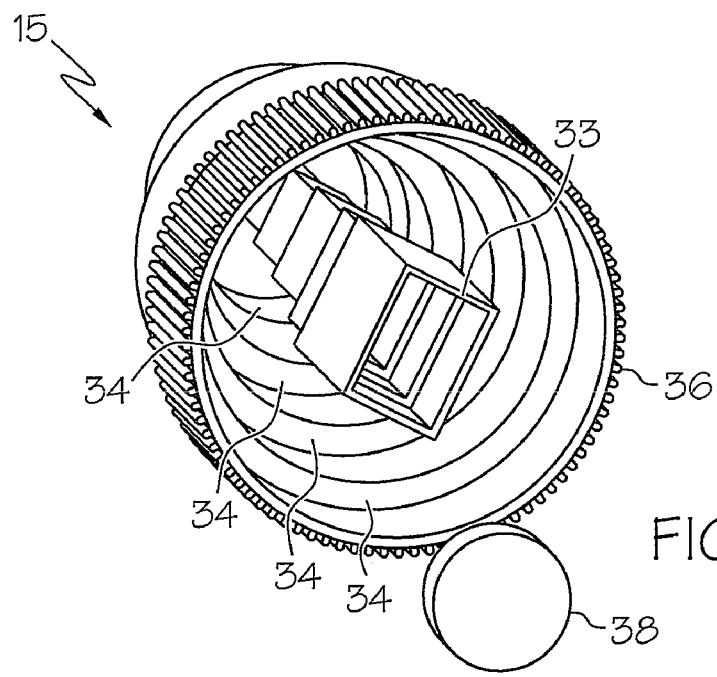
Figure 5:
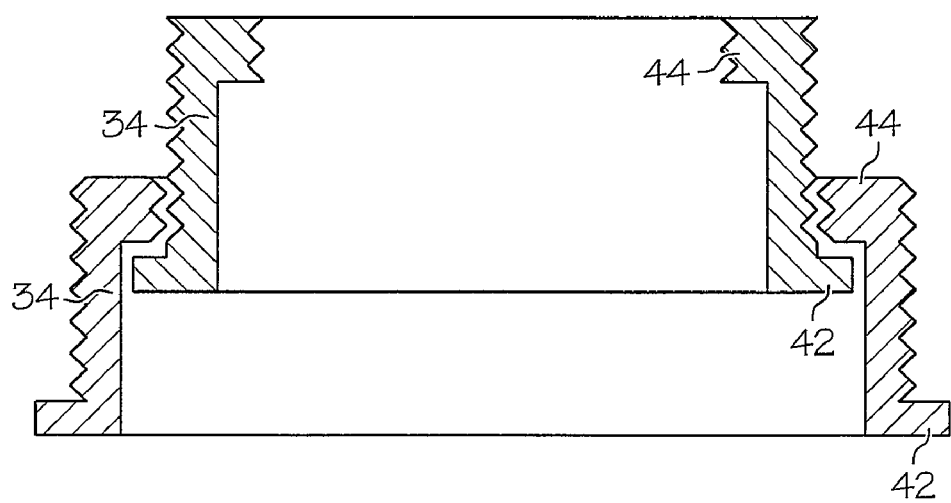
FIG. 5 is a partial cross-section view depicting the linear translation mechanism of a contour control actuator in accordance with one embodiment of the present invention.

Now described with reference to FIGS. 3-5 are the design and implementation details of contour control actuators such as may be implemented within thermal control apparatus 5 in accordance with the invention. FIG. 3 depicts a perspective view of a pair of contour control actuators 15a and 15b. Contour controllers 15a and 15b are preferably independently controllable devices for adjusting the z-axis contour of flexible sheet 20. As shown in FIG. 3, contour control actuators 15a and 15b are fixedly disposed in a substantially planar manner with base members 32a and 32b adjacently affixed on a planar surface. Each of contour control actuators 15a and 15b further includes an extensible end 40 that is electromechanically or pneumatically extendable in parallel with the z-axis normal to a PCB surface.

Figure 6:
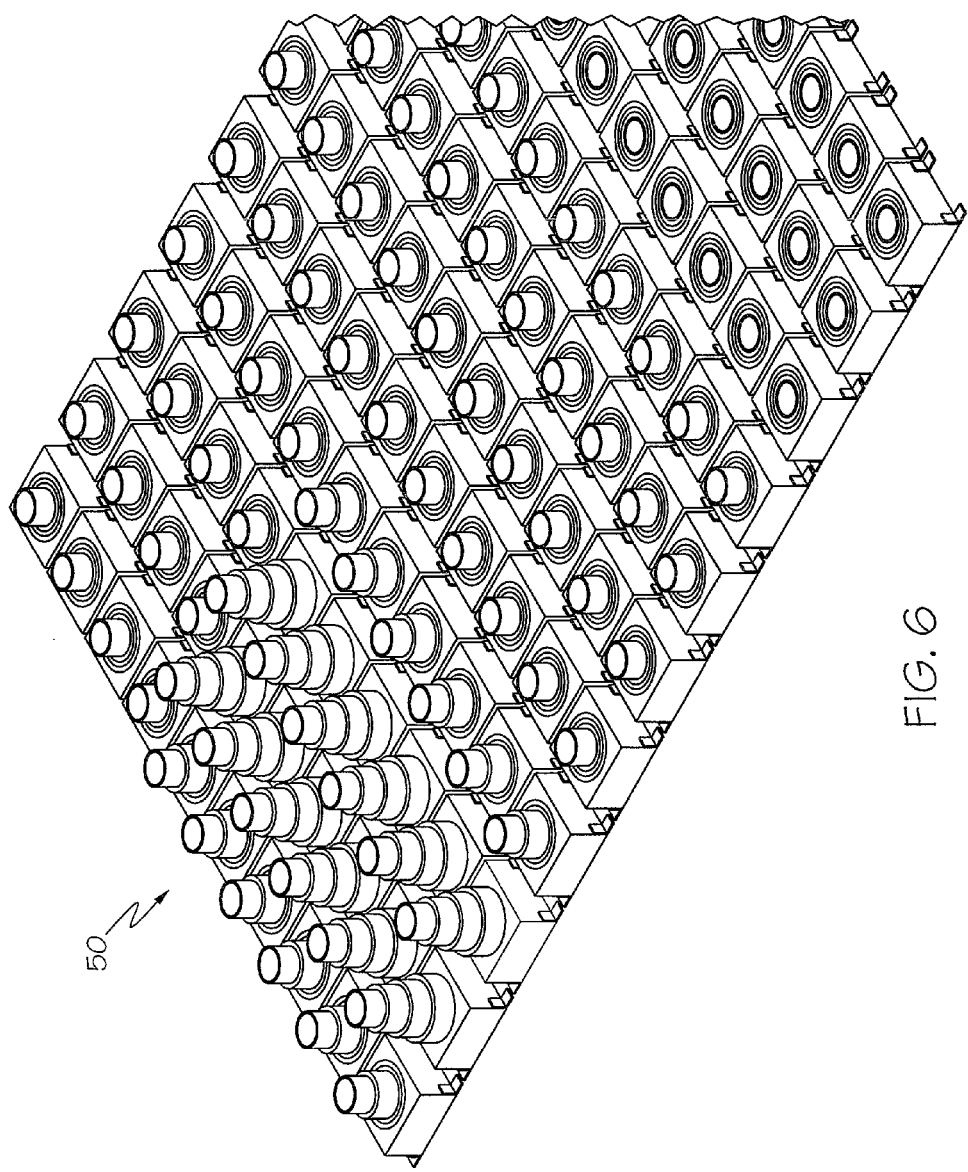
FIG. 6 illustrates a partial perspective view of an array of contour control actuators in accordance with one embodiment of the present invention.

Each of contour control actuators 15a and 15b includes a controllable z-direction translation mechanism. In a preferred embodiment, the translation mechanism consists of a small dc motor (not depicted) housed within base 32. When, as shown in FIG. 6, the contour control actuators are implemented in a matrix array 50, the motors may be activated in a row-wise and column-wise addressable manner by contour control signals. When a given contour control actuator 15 is addressed, the motor activates in a traditional dc motor rotating manner, which as depicted and described with reference to FIGS. 4-5 results in linear translation of extensible end 40. Using a small geared-down electric motor drive provides a fixed position and retains that position with power removed. The motor and gear reduction provides enough resistance torque to prevent the devices from moving due to the force of air itself.

Figure 7:
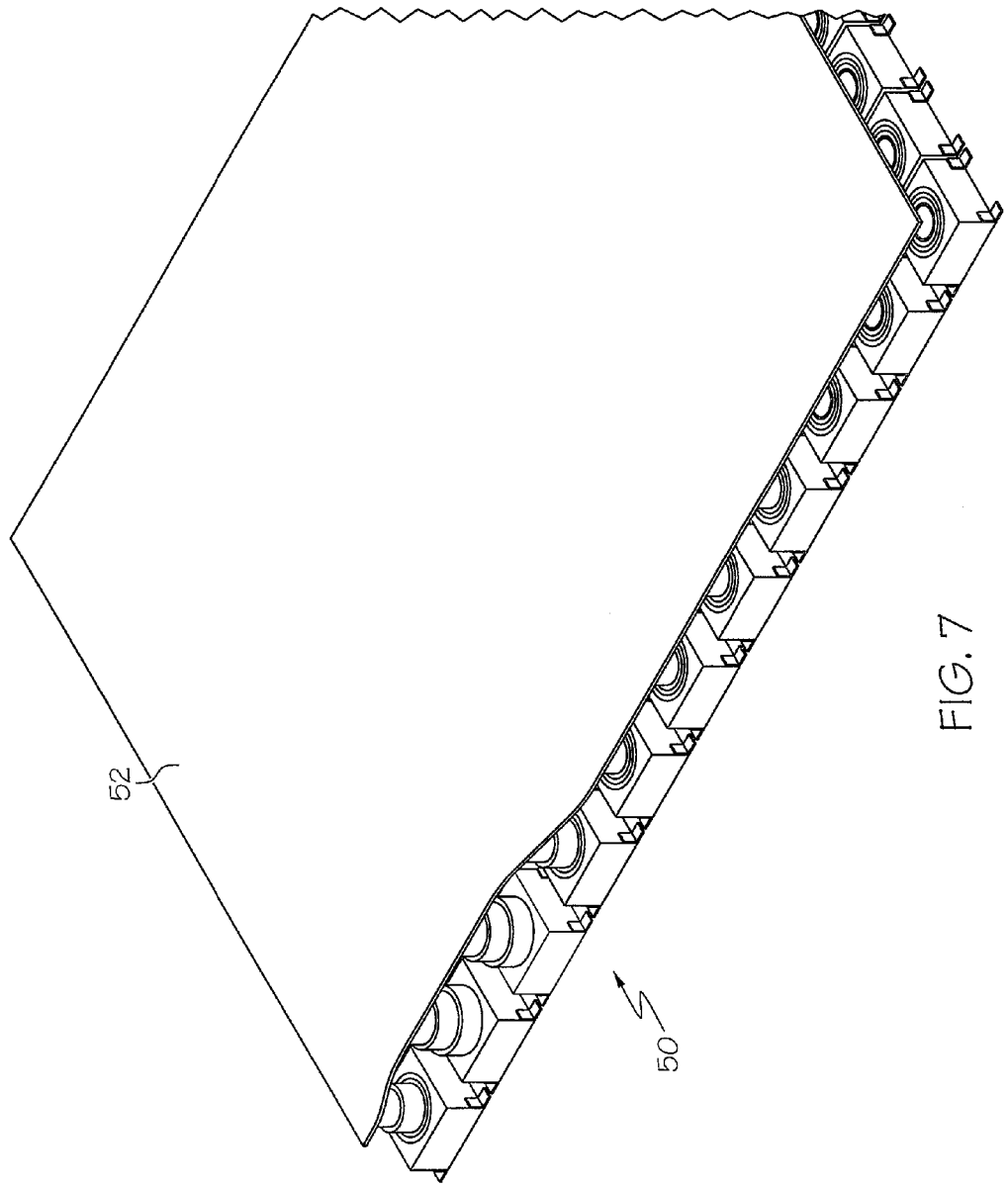
FIG. 7 depicts a partial perspective view of a thermal control apparatus as including an array of contour control actuators in functional deployment with a flexible sheet member in accordance with the present invention.

FIG. 6 illustrates a partial perspective view of a matrix array 50 arrangement of contour control actuators in accordance with one embodiment of the present invention. FIG. 7 depicts a partial perspective view of a thermal control apparatus as including contour controller array 50 in functional deployment with a flexible sheet 52 such as may be implemented during a thermal design phase in which an optimum contoured surface is to be determined and utilized to produce a fixed form surface contour. As shown in FIG. 7 and FIG. 2, the extensible ends of each of the actuators in array 50 abut flexible sheet 52 in a manner such that the contour of the portions of flexible sheet 52 in radial proximity to each of the actuators is determined by the z-axis position of the respective extensible ends.

FIGS. 4A-4B illustrate bottom perspective views of the telescopically extensible portion of a contour control actuator in a retracted and extended deployment position in accordance with the present invention. FIG. 4A depicts the fully retracted position while FIG. 4B shows the telescopically extensible portion in an extended position. As shown in FIGS. 4A and 4B, the telescopically extensible portion comprises a slidably extensible/collapsible column 33 disposed centrally within multiple annularly nested cylinders 34. Affixed to the outer circumferential surface of the outermost of nested cylinders 34 is a drive gear 36 that engages a drive spindle 38. When in the fully retracted position depicted in FIG. 4A, the assembly comprising slidable column 33, nested cylinders 34, drive gear 36 and drive spindle 38 is preferably contained within a motor housing unit such as base 32.

The assembly depicted in FIGS. 4A and 4B enables the extensible end 40 shown in FIG. 3 to be linearly translated to various extended positions in accordance with signals from contour controller 6. With reference now to FIG. 5 in conjunction with FIGS. 4A and 4B, the structure and operation of the telescopically extensible portion of a contour control actuator is now described. As shown in FIG. 5, the outer cylindrical walls of nested cylinders 34 are threaded such that each given cylinder successively engages an inwardly threaded flanged rim 44 of the adjacent outer cylinder in a manner enabling mutual linear translation of the inner cylinder relative to the next adjacent outer cylinder when the outer cylinder rotates with respect to the inner cylinder.

The motive translation force for the overall assembly originates with the dc motor (not depicted) which applies the rotational motive force to drive spindle 38 that engages drive gear 36. The innermost of nested cylinders 34 is fixed to the non-rotating sidable column 33 which is non-rotatable and fixedly attached at its base end to a stationary attachment point (not depicted) within base 32. In this manner, the innermost of the nested cylinders is always prevented from rotating regardless of the extended/retracted position of the assembly.

Assuming the assembly is in the fully retracted position shown in FIG. 4A, and with drive spindle 38 engaging the outermost of the nested cylinders 34 via drive gear 36, all of the nested cylinders 34 except the innermost cylinder initially rotate together as a unit. The rotation of the outer cylinders about the innermost cylinder results in the outward (from the base) linear translation of the innermost cylinder with relative to the outer cylinders. The translation of the innermost cylinder continues until a locking collar 42 of the innermost cylinder contacts the inwardly flanged rim 44 of the successively next outer cylinder. Engagement of the locking collar 42 with the inwardly flanged rim 44 prevents further rotation of the outer cylinder with respect to the innermost cylinder and causes the immediately adjacent outer cylinder to become locked with the innermost cylinder, thus preventing further rotation of the outer cylinder. As drive spindle 38 continues to rotate the innermost and successively adjacent cylinders are linearly translated as a unit and the process continues similarly for each successive cylinder until the assembly becomes fully extended or the spindle driven rotation is otherwise halted at a desired extension position.

Figure 8:
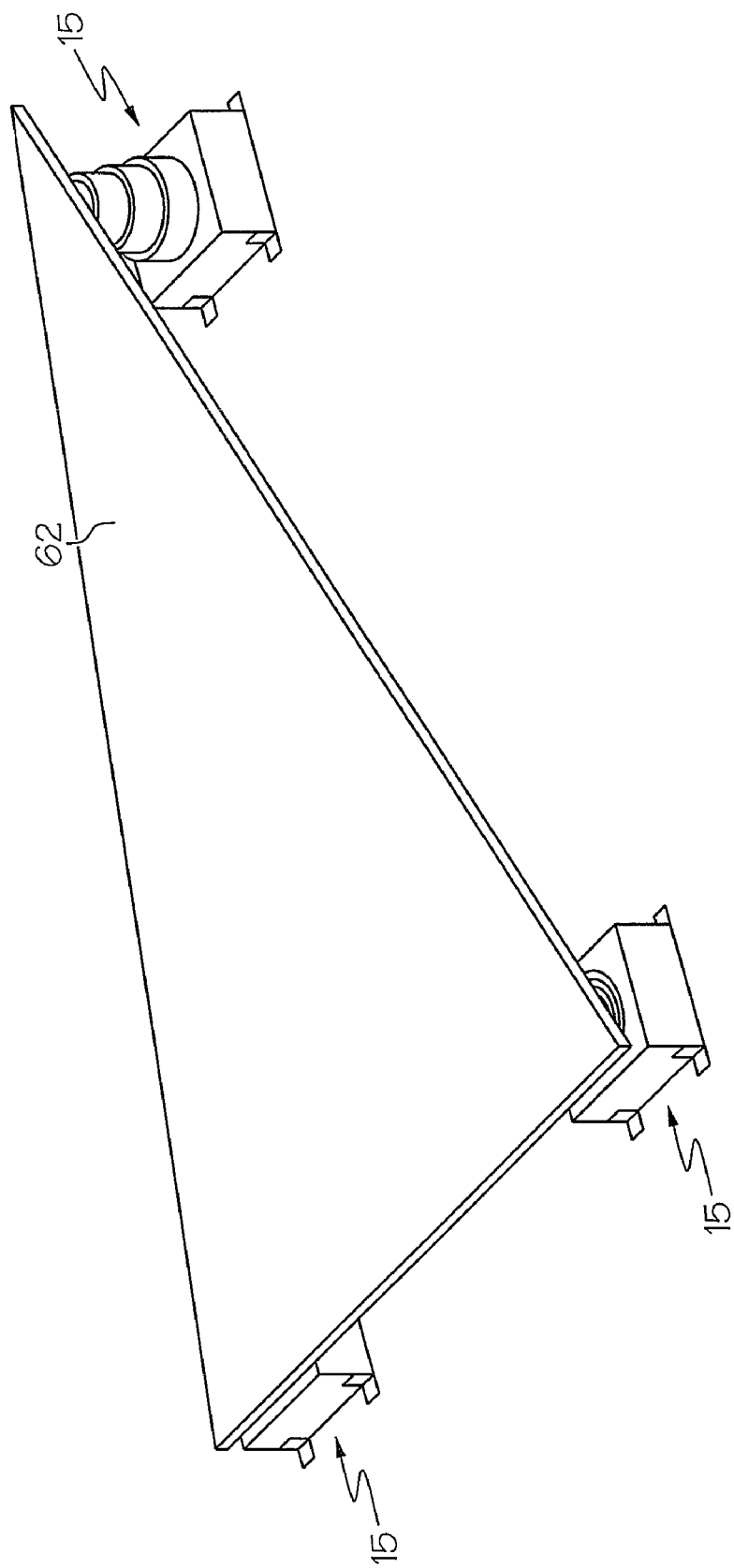
FIG. 8 illustrates an airflow guide apparatus in accordance with an alternate embodiment of the present invention.

FIG. 8 illustrates an airflow guide apparatus in accordance with an alternate embodiment of the present invention. The apparatus comprises an airflow guide 62 supported and adjustably positioned at various points by contour control actuators 15. In the depicted configuration, airflow guide 62 has a specified shape such as may be determined in accordance with the aforementioned hybrid application for optimizing the airflow across a circuit board (not depicted). This applies to a board with an opposing wall that can be used to deflect the air flowing through the enclosure onto the components needing additional cooling.

Figure 9:
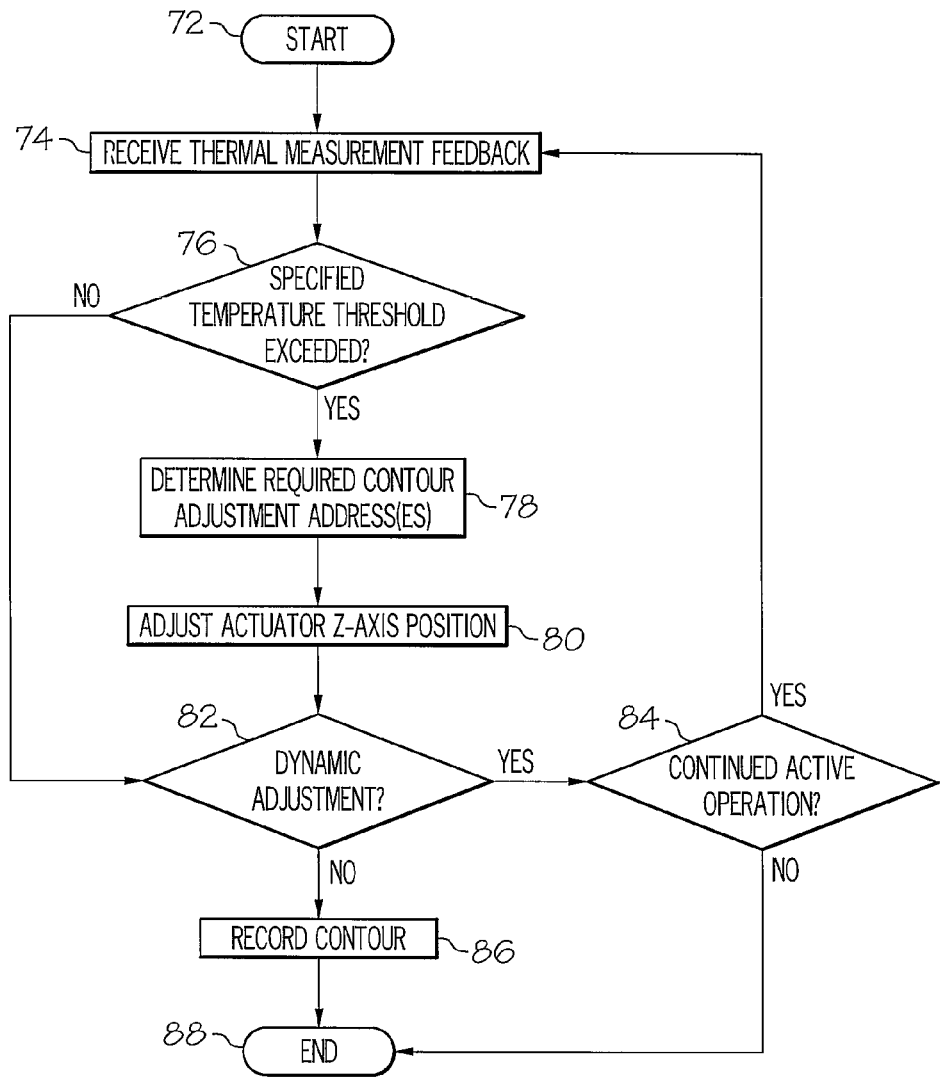
FIG. 9 is a high-level flow diagram depicting steps performed by a PCB thermal management system during a design or operation in accordance with the present invention.

FIG. 9 is a high-level flow diagram depicting steps performed by PCB thermal management system 100 during a design or operation in accordance with the present invention. The thermal management process begins as shown at steps 72 and 74 with contour controller 6 receiving thermal data indicating thermal conditions within chassis 4. Such thermal data may be obtained from thermal sensors 8. As depicted at step 76 contour controller 6 uses the received thermal data to determine whether one or more specified temperature threshold(s) have been exceeded. Contour controller 6 may perform this determination by comparing the thermal data received at step 74 with a specified thermal limit or range.

Responsive to the thermal data indicating that no temperature threshold has been exceeded and assuming thermal management system 100 is being utilized to determine a fixed form surface contour and not for dynamic runtime contour adjustability, the present contour of flexible sheet 20 is recorded and the process ends as shown at steps 82, 86, and 88. If no threshold has been exceeded while thermal management system 100 is being utilized with thermal control apparatus 5 deployed to make dynamic runtime adjustments to the contour of flexible sheet 20, the contour controller 6 continues monitoring thermal data as shown at steps 82, 84, and 74.

In response to the thermal data indicating that a specified temperature threshold has been exceeded, contour controller 6 determines the manner in which the contour of flexible sheet 20 should be adjusted. As a part of this determination, and as shown at step 78, contour controller 6 references stored reference values that indicate the positions or addresses of the actuators that should be activated for contour adjustment. As shown at step 80, contour controller 6 utilizes the position/address information to access the appropriate actuators and adjust the z-axis positions of the extensible ends of one or more of the contour control actuators to adjust the z-axis contour of flexible sheet 20.

While the invention has been particularly shown and described with reference to a preferred embodiment, it will be understood by those skilled in the art that various changes in form and detail may be made therein without departing from the spirit and scope of the invention. These alternate implementations all fall within the scope of the invention.

What is claimed is:

1. A thermal management system comprising:
   a printed circuit board (PCB) having a first surface on which electronic components are mounted;
   a plurality of contour control actuators fixedly disposed in a substantially planar array in z-axis opposition to the first surface of said PCB, each of said plurality of contour control actuators having an extensible end that is electromechanically extendable in parallel with the z-axis normal to the first surface of said PCB;
   a substantially flexible sheet member disposed between the extensible ends of said plurality of contour control actuators and the first surface of said PCB, the extensible ends contacting said flexible sheet member such that the z-axis contour of said flexible sheet member is determined by the z-axis positions of the extensible ends; and
   a contour controller that adjusts the z-axis contour of said flexible sheet member by adjusting the relative positions of the extensible ends of one or more of said contour control actuators, wherein said contour controller adjusts the relative positions of the extensible ends in accordance with thermal conditions proximate to said PCB.

2. The thermal management system of claim 1, wherein the extensible ends abut said flexible sheet member in a manner such that the contour of the portions of said flexible sheet member in radial proximity to one or more of said plurality of contour control actuators is determined by the z-axis position of the extensible ends.

3. The thermal management system of claim 1, further comprising a thermal control apparatus that includes said PCB, said plurality of contour control actuators, and said flexible sheet member contained within a substantially enclosed PCB housing.

4. The thermal management system of claim 3, further comprising a airflow actuating device for generating a forced airflow within said substantially enclosed PCB housing, said contour controller adjusting the relative positions of the extensible ends of one or more of said contour control actuators to adjust the z-axis contour of said flexible sheet member in a manner redirecting said forced airflow within said substantially enclosed PCB housing.

5. The thermal management system of claim 1, further comprising thermal sensors proximally disposed with respect to said PCB, said thermal sensors communicatively coupled to provide thermal data to said contour controller.

6. The thermal management system of claim 1, wherein each of said plurality of contour control actuators comprises multiple annularly nested cylinders that extend and retract telescopically to linearly translate a respective extensible end in accordance with signals from said contour controller.

7. The thermal management system of claim 1, wherein said contour controller individually selects one or more subgroups of said plurality of contour control actuators for position control of the extensible ends.

8. The thermal management system of claim 1, wherein said contour controller adjusts the position of the extensible ends one or more of said contour control actuators in accordance with airflow data received by said contour controller.

9. A method for controlling a thermal environment of a printed circuit board (PCB) mounted within an enclosure, said PCB having a first surface on which electronic components are mounted, the enclosure housing a plurality of contour control actuators that are fixedly disposed in a substantially planar array in z-axis opposition to the first surface of the PCB, each of the plurality of contour control actuators having an extensible end that is electromechanically extendable in parallel with the z-axis normal to the first surface of the PCB, the enclosure further housing a substantially flexible sheet member disposed between the extensible ends of the plurality of contour control actuators and the first surface of the PCB such that a first surface of the flexible sheet member faces the first surface of the PCB, the extensible ends contacting the flexible sheet member such that the z-axis contour of the first surface of the flexible sheet member is adjustably controllable by the z-axis positions of the extensible ends, said method comprising:
   receiving thermal data determined from within the enclosure;
   comparing the thermal data with a specified thermal limit;
   responsive to the thermal data exceeding the specified thermal limit, determining a z-axis contour adjustment for said flexible sheet member; and
   adjusting the z-axis contour of said flexible sheet member by adjusting the z-axis positions of the extensible ends of one or more of said contour control actuators in accordance with the determined z-axis contour adjustment.

10. The method of claim 9, wherein the PCB, the plurality of contour control actuators, and the flexible sheet member form a PCB thermal control apparatus substantially housed within the enclosure, said method further comprising dynamically adjusting the z-axis contour of the flexible sheet member to maintain thermal conditions proximate to the PCB substantially within the specified thermal limit.

11. The method of claim 9, further comprising recording a z-axis surface contour of the flexible sheet member resulting from said adjusting step.

12. The method of claim 11, further comprising forming a substantially non-flexible member having a first surface that is contoured in conformity with the recorded z-axis surface contour.

* * * * *